(12) United States Patent
Jang et al.

(10) Patent No.: US 7,345,508 B1
(45) Date of Patent: Mar. 18, 2008

(54) PROGRAMMABLE LOGIC DEVICE HAVING A PROGRAMMABLE SELECTOR CIRCUIT

(75) Inventors: Tetse Jang, San Jose, CA (US); Soren T. Soe, San Jose, CA (US); Scott Te-Sheng Lien, Palo Alto, CA (US)

(73) Assignee: Xilinx, Inc., San Jose, CA (US)

( * ) Notice: Subject to any disclaimer, the term of this patent is extended or adjusted under 35 U.S.C. 154(b) by 74 days.

(21) Appl. No.: 11/338,361

(22) Filed: Jan. 24, 2006

(51) Int. Cl.
*H01L 25/00* (2006.01)
*H03K 19/177* (2006.01)

(52) U.S. Cl. ............................. 326/41; 326/38; 326/47

(58) Field of Classification Search ................. 326/41, 326/121, 37, 38, 39, 47
See application file for complete search history.

(56) References Cited

U.S. PATENT DOCUMENTS 6,034,541 A * 3/2000 Kopec et al. ................. 326/39
6,608,500 B1 * 8/2003 Lacey et al. .................. 326/39
7,129,747 B1 * 10/2006 Jang et al. .................... 326/38

* cited by examiner

*Primary Examiner*—Rexford Barnie
*Assistant Examiner*—Crystal L Hammond
(74) *Attorney, Agent, or Firm*—LeRoy D. Maunu; Lois D. Cartier

(57) ABSTRACT

A PLD is configurable to efficiently implement a wide variety of user functions. The PLD includes a programmable interconnect circuit, programmable logic circuits, one-bit registers, selector circuits, and input/output blocks. The programmable interconnect circuit is configurable to connect the signal lines of its output ports to the signal lines of its input ports. The programmable logic circuits are configurable to implement a programmable function generating one-bit signal values from a respective output port of the programmable interconnect circuit. The one-bit registers store a respective one of these one-bit signal values. The programmable selector circuits are each coupled to output ports of a plurality of the one-bit registers, with each of these one-bit registers coupled to a respective one of the programmable logic circuits. The programmable input/output blocks are each coupled to an output port of a respective programmable selector circuit and to a respective input port of the programmable interconnect circuit.

16 Claims, 8 Drawing Sheets

US 7,345,508 B1

PROGRAMMABLE LOGIC DEVICE HAVING A PROGRAMMABLE SELECTOR CIRCUIT

FIELD OF THE INVENTION

The present invention generally relates to architectures for programmable logic devices.

BACKGROUND

Programmable logic devices (PLDs) may be programmed to implement a wide variety of user functions. A PLD provides configurable resources of various types, including configurable logic resources, configurable routing resources, and configurable input/output resources. An example configurable logic resource is a programmable logic array (PLA) having a set of binary inputs, a set of binary outputs, and a set or internal binary product-terms. Each of the internal product-terms may be the AND of a configurable subset of the binary inputs, and each of the binary outputs may be the OR of a configurable subset of the internal product-terms. An example routing resource is a switchbox having a set of binary inputs and a set of binary outputs. Each of the binary outputs may be connected to a configurable one of the binary inputs. An example configurable input/output resource is an input/output block configurable to either drive a binary value to an external port of the PLD or receive a binary value from the external port.

A PLD is programmed to perform a specific user function by loading the PLD with configuration data that is generated from a specification of the specific user function. The configuration data provides the configuration for each of the configurable resources of the PLD. The loaded configuration data may be stored in volatile or non-volatile memory of the PLD.

The configurable resources of the PLD provide a set of building blocks that are frequently used by typical user functions. Generally, certain ones of the configurable resources may go unused by a specific user function. In addition, when a specific user function requires more of a particular type of configurable resource than is available in the PLD, the PLD may not be capable of implementing the function. Such functions may require burdensome modification of the user's design and/or use of a more expensive PLD with more configurable resources. There is a general need for PLD architectures that allow a wide variety of user functions to be efficiently implemented, especially for user functions with resource requirements near the limit of the capabilities of the PLD.

The present invention may address one or more of the above issues.

SUMMARY OF THE INVENTION

Various embodiments of the invention provide a programmable logic device (PLD) configurable to implement a user design. The PLD includes a programmable interconnect circuit, programmable logic circuits, one-bit registers, selector circuits, and input/output blocks. The programmable interconnect circuit is configurable to connect the signal lines of the output ports of the programmable interconnect circuit to the signal lines of the input ports of the programmable interconnect circuit. The programmable logic circuits are configurable to implement a programmable function that generates one-bit signal values from values from a respective output port of the programmable interconnect circuit. The one-bit registers store a respective one of the one-bit signal values from one of the programmable logic circuits. The programmable selector circuits are each coupled to output ports of a plurality of the one-bit registers, with each of these one-bit registers coupled to a respective one of the programmable logic circuits. The programmable input/output blocks are each coupled to an output port of a respective one of the programmable selector circuits and to a respective one of the input ports of the programmable interconnect circuit.

Various other embodiments of the invention provide a method for generating a configuration of a programmable logic device (PLD) that is configurable to implement a user design having a plurality of next-state functions and a plurality of output functions. The next-state and output functions of the user design are mapped to programmable logic circuits and programmable selector circuits of the PLD, wherein each of the output functions is mapped at least to a respective one of the programmable selector circuits that has an associated one of a plurality of pads of the PLD. Binary state variables of the next-state functions are mapped to one-bit registers that are arranged in one or more functional matrices of the PLD. For each column of each functional matrix, the one-bit registers of the column are coupled to one of the programmable logic circuits corresponding to the column, and for each row of each functional matrix, the one-bit registers of the row are coupled to one of the programmable selector circuits corresponding to the row. A configuration is generated for the programmable logic circuits, and for each of the programmable logic circuits and corresponding column of a functional matrix, the one-bit registers of the column are arranged to store the binary state variables of each of the next-state functions that is mapped to the programmable logic circuit. A configuration is generated for the programmable selector circuits, with the respective one of the programmable selector circuits for each one of the output functions transmitting a value at the associated one of the pads.

Yet another embodiment of the invention provides a program storage medium that includes a processor-readable device configured with instructions. Execution of the instructions by one or more processors causes the one or more processors to perform operations that generate a configuration of a programmable logic device (PLD) that is configurable to implement a user design having a plurality of next-state functions and a plurality of output functions.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

Figure 1:
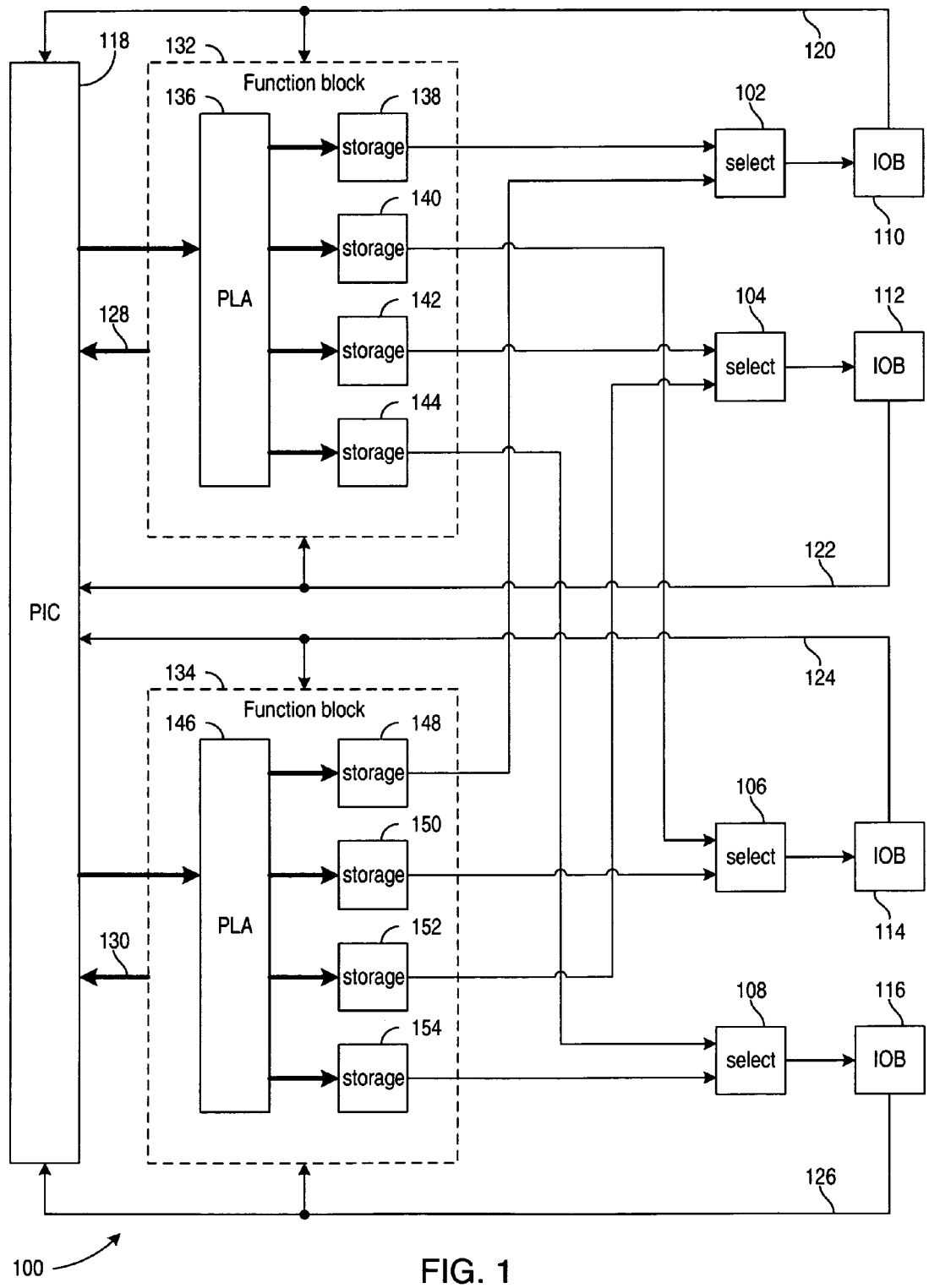
FIG. 1 is a block diagram of a PLD having programmable selector circuits in accordance with various embodiments of the invention.

FIG. 1 is a block diagram of a PLD having programmable selector circuits 102, 104, 106, and 108 in accordance with various embodiments of the invention. The PLD 100 may be programmed with configuration data that implements a user design, such as a state machine having a next-state function for each binary state variable of the state machine and an output function for each output bit of the state machine. Each of input/output blocks (IOBs) 110, 112, 114, and 116 may be configurable to implement an input bit of the user design and/or an output bit of the user design.

Each of IOBs 110, 112, 114, and 116 may be configured as an input that receives a binary value from an associated pad of the PLD, and these binary input values may be coupled to programmable interconnect circuit 118 via respective lines 120, 122, 124, and 126. Programmable interconnect circuit 118 may have an input port for each of IOBs 110, 112, 114, and 116 and another input port for feedback on lines 128 and 130 from function blocks 132 and 134. Programmable interconnect circuit 118 may also have an output port for each of function blocks 132 and 134, and programmable interconnect circuit 118 may be configurable to connect the signal lines of the output ports to the signal lines of the input ports. In one embodiment, programmable interconnect circuit 118 is a programmable interconnect matrix configurable to connect each of the signal lines of the output ports to a configurable one of the signal lines of the input ports.

Function block 132 may include a programmable logic array (PLA) 136 and multiple 1-bit storage arrangements 138, 140, 142, and 144 that may be macrocells. Function block 134 may similarly include PLA 146 and 1-bit storage arrangements 148, 150, 152, and 154. The PLA 136 may be configurable to generate various control and data signals for the 1-bit storage arrangements 138, 140, 142, and 144 from the signal values of the corresponding output port of the programmable interconnect circuit 118. Each of 1-bit storage arrangements 138, 140, 142, and 144 may include a one-bit register that may store a data signal generated by the PLA 118. The data signal may be the value of a next-state function of a state machine of the user design and the one-bit register may store a binary state variable of the next-state function. It will be appreciated that each of the 1-bit storage arrangements 138, 140, 142, and 144 may include configurable logic in addition to a one-bit register, and a programmable logic circuit (not shown) of function block 132 may include the PLA 136 and the configurable logic of the 1-bit storage arrangements 138, 140, 142, and 144.

Programmable selector circuits 102, 104, 106, and 108 may select and output a value from 1-bit storage arrangements 138, 140, 142, 144, 148, 150, 152, and 154. For example, programmable selector circuit 102 may select and output a value from 1-bit storage arrangements 138 and 148. The value from 1-bit storage arrangement 138, for example, may be a value of a binary state variable of a next-state function of a user design that is stored in a one-bit register in the 1-bit storage arrangement 138. Generally, each programmable selector circuit may select and output a value from multiple 1-bit storage arrangements that are in different function blocks. The value output by programmable selector circuits 102, 104, 106, and 108 may be supplied to IOBs 110, 112, 114, and 116, respectively. Each of IOBs 110, 112, 114, and 116 may be configured as an output bit that transmits a binary value to an associated pad of the PLD.

Figure 2:
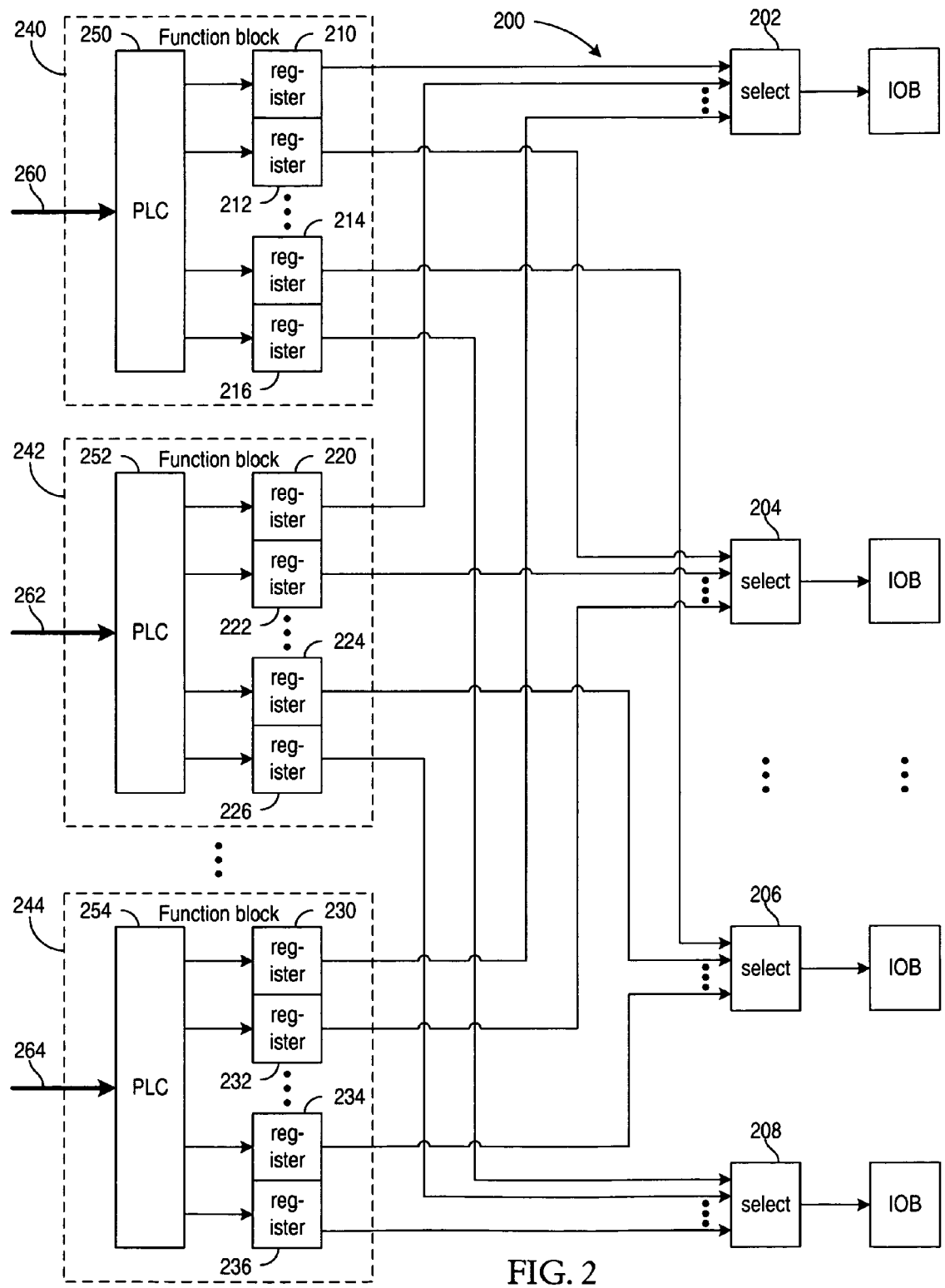
FIG. 2 is a block diagram illustrating the programmable selector circuits and certain associated circuits of a PLD in accordance with various embodiments of the invention.

FIG. 2 is a block diagram illustrating the programmable selector circuits 202, 204, 206, and 208, and certain associated circuits of a PLD 200 in accordance with various embodiments of the invention. Each of programmable selector circuits 202, 204, 206, and 208 may have inputs from two or more one-bit registers 210 through 236 in different function blocks 240, 242, and 244, and function blocks 240, 242, and 244 may respectively include programmable logic circuits 250, 252, and 254 and two or more of the one-bit registers 210 through 236.

In one embodiment, a PLD 200 has one or more functional matrices of one-bit registers, with one functional matrix of one-bit registers 210 through 236 shown in FIG. 2. The functional matrix may arrange the one-bit registers 210 through 236 into columns and rows. The PLD 200 may have the one-bit registers 210 through 236 physically arranged in columns and rows. Alternatively, the PLD 200 may have the one-bit registers 210 through 236 functionally arranged (as shown in FIG. 2) in a matrix of columns and rows, which does not necessarily correspond to a physical matrix arrangement. Generally, a functional matrix has a respective column for each programmable logic circuit 240, 242, and 244 including the one-bit registers that are coupled to the programmable logic circuit, and a respective row for each programmable selector circuit 202, 204, 206, and 208 including the one-bit registers that are coupled to the programmable selector circuit. A first column may include one-bit registers 210, 212, 214, and 216, a second column may include one-bit registers 220, 222, 224, and 226, and a third column may include one-bit registers 230, 232, 234, and 236. A first row may include one-bit registers 210, 220, and 230, a second row may include one-bit registers 212, 222, and 232, a third row may include one-bit registers 214, 224, 234, and a fourth row may include one-bit registers 216, 226, and 236.

The PLD 200 might or might not have a physical structure in an integrated circuit that corresponds to the columns and rows of the one or more functional matrices. In one embodiment, the columns of a functional matrix have a corresponding physical structure provided by the function blocks 240, 242, and 244, and the rows of the functional matrix may have a corresponding physical structure provided by physically adjacent instances of function blocks 240, 242, 244, and programmable selector circuits 202, 204, 206, and 208 in the integrated circuit.

It will be appreciated that a PLD 200 does not necessarily have a physical structure corresponding to the functional matrices. For example, a PLD without function blocks may have one or more functional matrices of the one-bit registers, with the one-bit registers that are coupled to a programmable logic circuit corresponding to a column of the one-bit registers, and the one-bit registers coupled to a programmable selector circuit corresponding to a row of the one-bit registers.

In addition, a PLD might not have one-bit registers that are arranged in functional matrices for certain embodiments. For example, various embodiments of the invention have each one-bit register coupled to one programmable logic circuit and one programmable selector circuit, with multiple one-bit registers coupled to each programmable logic circuit and multiple one-bit registers coupled to each programmable selector circuit, and each of the one-bit registers that is coupled to one of the programmable selector circuits coupled to a respective one of the programmable logic circuits.

Each programmable logic circuit 250, 252, and 254 is coupled to a respective output port of a programmable interconnect circuit (not shown) via lines 260, 262, and 264. Each of the programmable logic circuits 250, 252, and 254 is configurable to implement a programmable function of signal values from the respective output port of the programmable interconnect circuit. The programmable function generates one-bit signal values that may be stored in the one-bit registers, for example, the programmable function for programmable logic circuit 250 may generate one-bit signal values, with a respective one of these one-bit signal values stored in each of one-bit registers 210, 212, 214, and 216.

Figure 3:
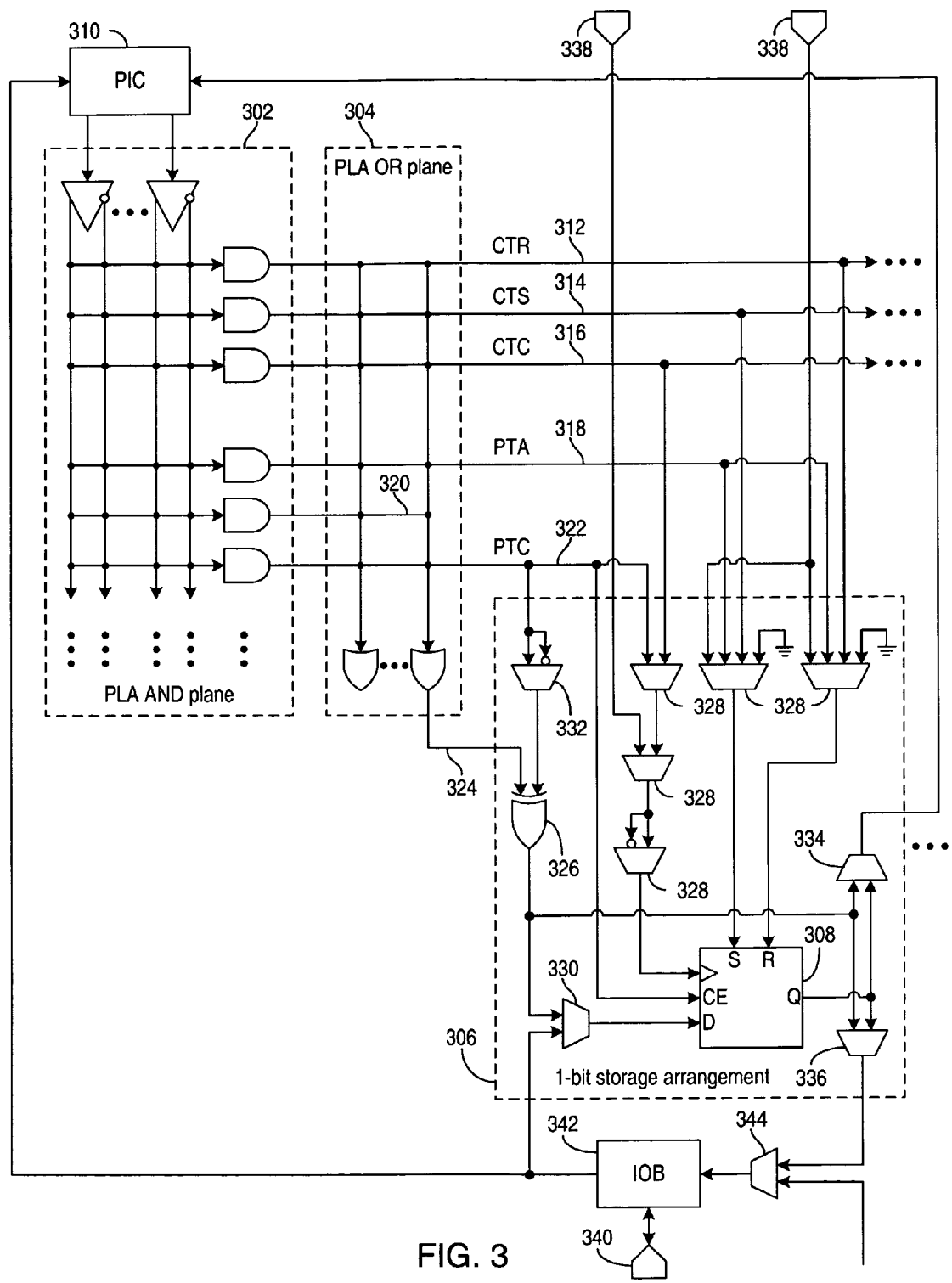
FIG. 3 is a block diagram illustrating an example programmable logic circuit and certain associated circuits of a PLD in accordance with various embodiments of the invention.

FIG. 3 is a block diagram illustrating an example programmable logic circuit and certain associated circuits of a PLD in accordance with various embodiments of the invention. The programmable logic circuit may include a PLA, which has an AND-plane 302 and an OR-plane 304, and configurable logic of a 1-bit storage arrangement 306. The 1-bit storage arrangement 306 may include a one-bit register 308 in addition to the configurable logic of the programmable logic circuit.

A programmable interconnect circuit 310 may have an output port providing signal values to the AND-plane 302 of the PLA. The AND-plane 302 may generate a plurality of product terms including common reset on line 312, common set on line 314, common clock enable on line 316, and specific product terms on lines 318, 320, and 322. Each of these product terms may be generated from a AND of either the true or complement values of the signal values provided from the programmable interconnect circuit 310. The PLD may be configured with configuration data that selects whether or not each signal value from the programmable interconnect circuit 310 is included in each of the product terms 312 through 322 and for each signal value that is included in a particular product term, whether the true or complement of the signal value is used.

Generally, a PLA, having AND-plane 302 and OR-plane 304, is coupled to at least another 1-bit storage arrangement in addition to 1-bit storage arrangement 306. Each 1-bit storage arrangement may share the common product terms on lines 312, 314, and 316, and separate specific product terms similar to the specific product terms on lines 318, 320, and 322 may be generated by AND-plane 302 for each of the 1-bit storage arrangements.

PLA OR-plane 304 may be configured with configuration data that selects whether or not each of the product terms 312 through 322 from the AND-plane 302 is included in an AND generating the data value on line 324 for 1-bit storage arrangement 306 and similar ANDs generating data values for the other 1-bit storage arrangement or arrangements coupled to the PLA. Depending on the configuration data for the configurable logic of 1-bit storage arrangement 306, the data value on line 324 may be stored by one-bit register 308 of 1-bit storage arrangement 306.

XOR gate 326 and multiplexers 328 through 332 may be the configurable logic of 1-bit storage arrangement 306, and each of these multiplexers may be configured by configuration data to select and output one of the values received at the inputs of the multiplexer. The one-bit register 308 has control inputs of a clock, a clock enable, a set, and a clear that are generated by multiplexers 328 from external inputs from pads 338 and the product terms on lines 312, 314, 316, 318, and 322. The one-bit register 308 also has a data input and 1-bit storage arrangement 306 may be configured to store a data value in one-bit register 308 either from pad 340 via IOB 342 or from the data value on line 324 via XOR gate 326, as controlled by multiplexer 330. The one-bit register 308 may be configured to store either the true or complement of the data value on line 324 by controlling XOR gate 326 via multiplexer 332 and the specific product term on line 322. It will be appreciated that a PLD that is packaged may have a respective pin corresponding to each of pads 338 and 340.

The 1-bit storage arrangement 306 may be configured to supply programmable interconnect circuit 310 with either a data value from line 324 via XOR gate 326 or the value stored in one-bit register 308, as controlled by multiplexer 334. Programmable interconnect circuit 310 may also be supplied with a value from pad 340 depending on whether IOB 342 is configured to receive an input bit from pad 340. The 1-bit storage arrangement 306 may also be configured to supply programmable selector circuit 344 with either a data value from line 324 via XOR gate 326 or the value stored in one-bit register 308, as controlled by multiplexer 336. When multiplexer 336 is configured to select the data value from line 324 via XOR gate 326, the data value from line 324 may be used to generate an output function of the user design. Programmable selector circuit 344 may receive a signal value from 1-bit storage arrangement 306 and at least one other 1-bit storage arrangement that is coupled to a different PLA than the PLA having AND-plane 302 and OR-plane 304. The value selected and output by programmable selector circuit 344 may be output from the PLD at pad 340 when the IOB 342 is configured to transmit an output bit to pad 340.

Figure 4:
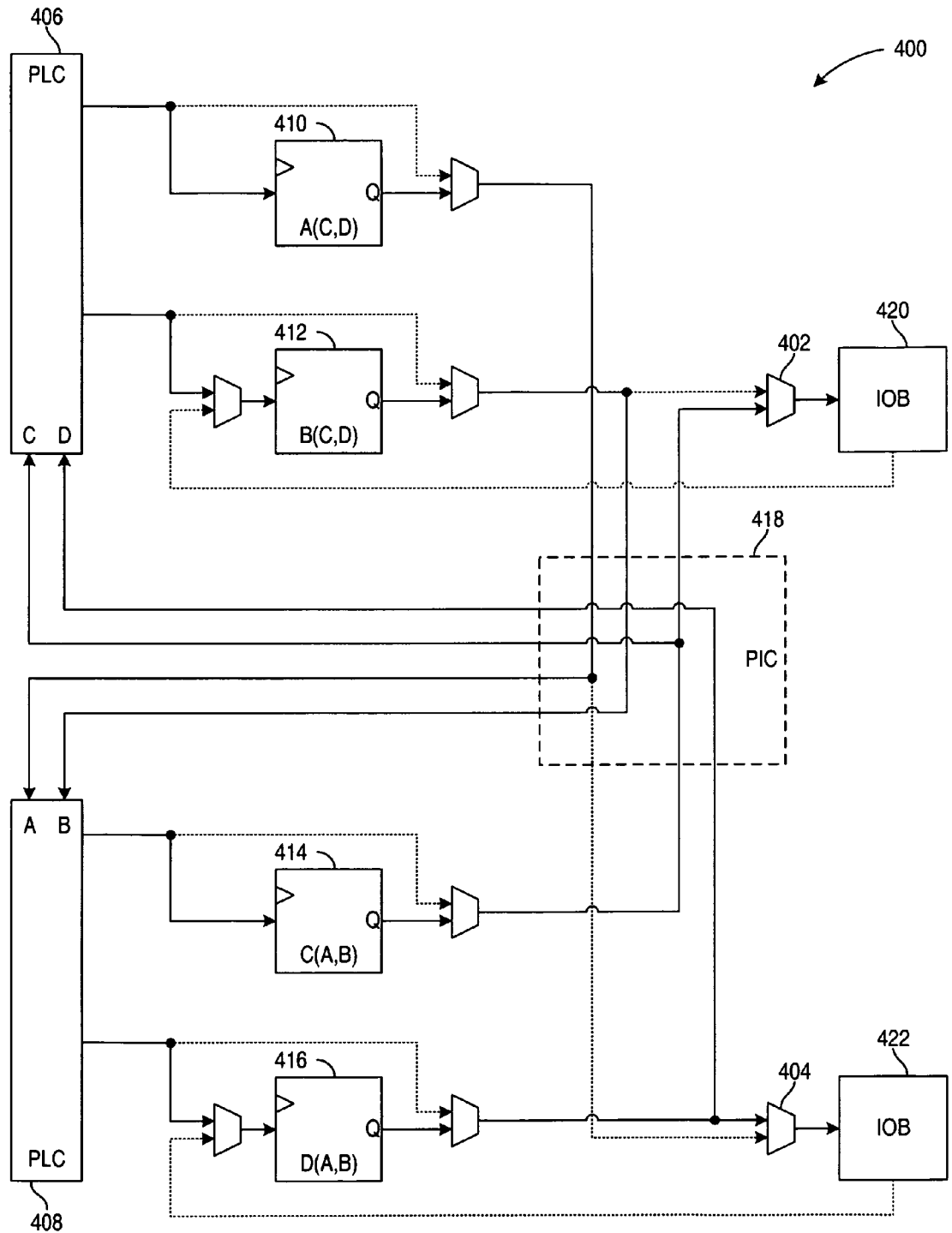
FIG. 4 is a block diagram of an example PLD configured to efficiently implement a user design using programmable selector circuits in accordance with various embodiments of the invention.

FIG. 4 is a block diagram of an example PLD 400 configured to efficiently implement a user design using programmable selector circuits 402 and 404 in accordance with various embodiments of the invention. The example PLD 400 has programmable selector circuits 402 and 404 that are 2-input multiplexers. The user design may be a state machine having 1-bit state variables A, B, C, and D with state variables C and D being outputs of the state machine. The user design may also include next-state functions A(C, D), B(C,D), C(A,B), and D(A,B).

The example PLD 400 has two programmable logic circuits 406 and 408. Programmable logic circuit 406 is coupled to the two one-bit registers 410 and 412, and programmable logic circuit 408 is coupled to the two one-bit registers 414 and 416, for a total of four one-bit registers to store the four binary state variables of the four next-state functions. The example PLD 400 may have a programmable logic circuit 406 that receives only two inputs from the programmable interconnect circuit 418 and a programmable logic circuit 408 that similarly receives only two inputs from the programmable interconnect circuit 418. Thus, in the example PLD 400, each programmable logic circuit 406 or 408 may receive at most two of the four state variables. Thus, next-state functions A(C,D) and B(C,D) sharing inputs state variables C and D should be implemented in one of programmable logic circuits 406 and 408 and next-state functions C(A,B) and D(A,B) should be implemented in the other programmable logic circuit.

Frequently for a user design, the mapping of next-state functions to programmable logic circuits 406 and 408 is determined by fitting an overlapped sharing of inputs of the next-state functions into the limited inputs of the programmable logic circuits. However, the mapping of a user design also includes mapping of the output functions of the user design. The programmable selector circuits 402 and 404 improve the flexibility of mapping the output functions of the user design, and thus increase the possible user designs that may be implemented in a PLD 400 as compared to the user designs that may fit into an existing PLD without programmable selector circuits 402 and 404. For example, an existing PLD without programmable selector circuits 402 and 404 may be similar to PLD 400, but with one-bit register 412 coupled to IOB 420, one-bit register 416 coupled to IOB 422, and one-bit registers 410 and 414 not coupled to any IOB 420 or 422. The example user design with next-state functions A(C,D), B(C,D), C(A,B), and D(A,B) and output functions of state variables C and D cannot be mapped to fit into such an existing PLD because next-state functions C(A,B) and D(A,B) should be mapped to one of the programmable logic circuits and none of the programmable logic circuits have two one-bit registers (for the state variables C and D) that are both coupled to IOBs.

In contrast for PLD 400 having programmable selector circuits 402 and 404, the programmable selector circuits 402 and 404 may be configured to deliver both of the state variables C and D to the IOBs 420 and 422. Programmable selector circuit 402 may supply the state variable C from one-bit register 414 to IOB 420, and programmable selector circuit 404 may supply the state variable D from one-bit register 416 to IOB 422. After mapping the next-state functions and output functions to programmable logic circuits 406 and 408 and to programmable selector circuits 402 and 404, the binary state variables of the next-state functions mapped to programmable logic circuit 406 may be mapped to one-bit registers 410 and 412, and the binary state variable of the next-state functions mapped to programmable logic circuit 408 may be mapped to one-bit registers 414 and 416. Configuration data to implement the next-state and output functions of the user design in the PLD 400 may then be generated according to these mappings.

Figure 5:
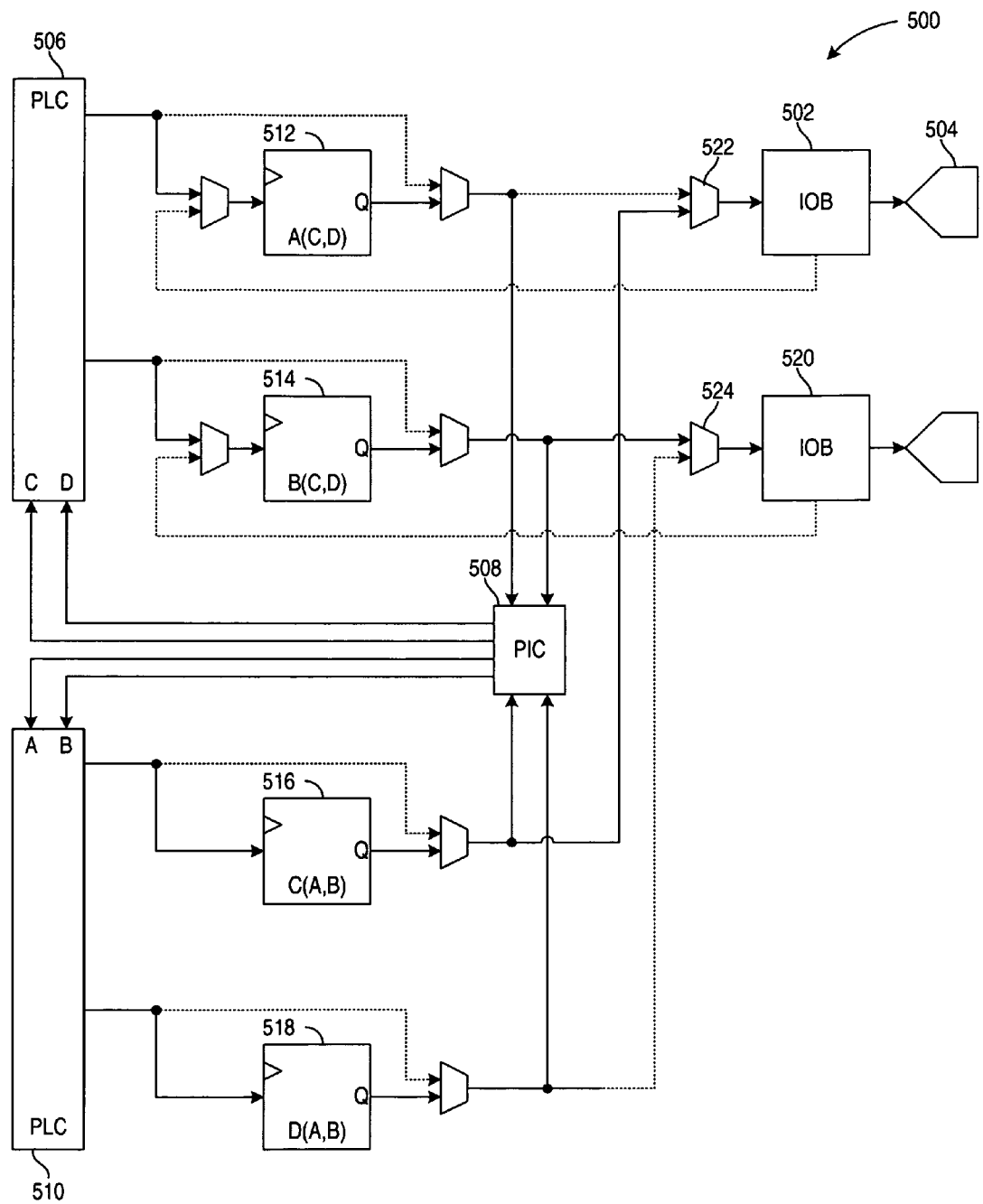
FIG. 5 is a block diagram of an example PLD configured to implement a user design including pin locking in accordance with various embodiments of the invention.

FIG. 5 is a block diagram of an example PLD 500 configured to implement a user design including pin locking in accordance with various embodiments of the invention. The user design may have next-state functions A(C,D), B(C,D), C(A,B), and D(A,B) for state variables A, B, C, and D with state variables B and C also being outputs of the state machine. The user design may also lock the output for state variable C to a particular IOB 502 and a pad 504 or corresponding pin of the PLD 500 that is coupled to the IOB 502.

Because programmable logic circuit 506 has two inputs from programmable interconnect circuit 508 and programmable logic circuit 510 also has two inputs from programmable interconnect circuit 508, next-state functions A(C,D) and B(C,D) should be implemented in one of programmable logic circuits 506 and 510, and next-state functions C(A,B) and D(A,B) should be implemented in the other one of programmable logic circuits 506 and 510. In one mapping of next-state functions, next-state functions A(C,D) and B(C, D) are mapped to programmable logic circuit 506, and next-state functions C(A,B) and D(A,B) are mapped to programmable logic circuit 510.

The mapping of next-state function C(A,B) to programmable logic circuit 510 and the pin locking of the output function of state variable C to IOB 502 may require that binary state variable C is mapped to one-bit register 516, and consequently binary state variable D is mapped to one-bit register 518. Because the other output function is state variable B and only IOB 520 remains unassigned, state variable B should be mapped to one-bit register 514, and consequently state variable A should be mapped to one-bit register 512.

In an embodiment having a functional matrix of the one-bit registers 512, 514, 516, and 518 with a first column of one-bit registers 512 and 514, a second column of one-bit registers 516 and 518, a first row of one-bit registers 512 and 516 corresponding to programmable selector circuit 522 and IOB 502, and a second row of one-bit registers 514 and 518 corresponding to programmable selector circuit 524 and IOB 520, the mapping of next-state functions to programmable logic circuits 506 and 508 may constraint the binary state variables for these next-state functions to columns of a functional matrix, and the pin locking of an output function that is one of these binary state variables may constraint this binary state variable to a row of the functional matrix. The mapping of next-state functions and the pin locking of an output function that is a binary state variable may constrain the binary state variable to a particular row and column of the functional matrix, and hence to a particular one-bit register. It will be appreciated that the pin locking of an output function that is not binary state variable may similarly constrain the mapping of binary state variable to one-bit registers.

To output state variable C, programmable selector circuit 522 is configured to select a signal value from register 516 and to output this signal value to IOB 502 and associated pad 504. To output state variable B, programmable selector circuit 524 is configured to select a signal value from register 514 and to output this signal value to IOB 520.

Figure 6:
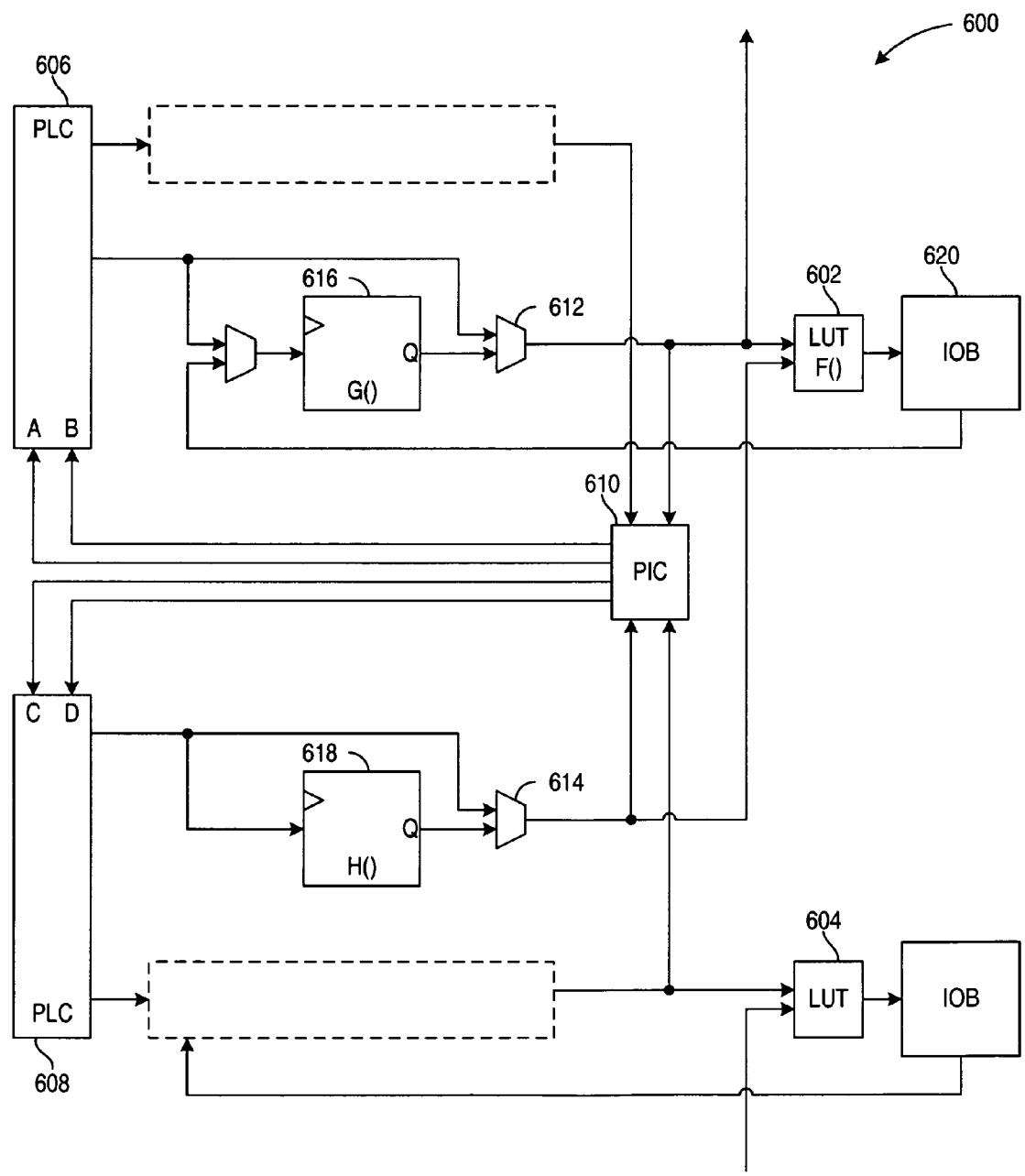
FIG. 6 is a block diagram of an example PLD having programmable selector circuits that are look-up tables (LUTs) in accordance with various embodiments of the invention.

FIG. 6 is a block diagram of an example PLD 600 having programmable selector circuits 602 and 604 that are look-up tables (LUTs) in accordance with various embodiments of the invention. The example PLD 600 may be configured to implement various user designs.

In one example user design, the user design includes an output function O(A,B,C,D) that is a function of four variables A, B, C, and D. Because each programmable logic circuit 606 and 608 receives only two inputs from the programmable interconnect matrix 610 in the example PLD 600, this output function may not be implemented in a single programmable logic circuit. However, factoring the output function into O(A,B,C,D)=F(G(A,B), H(C,D)) may be possible. Programmable logic circuit 606 may be configured to generate G(A,B) and programmable logic circuit 608 may be configured to generate H(C,D). Multiplexers 612 and 614 may be configured to bypass the generated G(A,B) and H(C,D) around registers 616 and 618, respectively. The LUT of programmable selector circuit 602 may be configured to implement the look-up function F(X, Y), with X=G(A,B) and Y=H(C,D) to generate the output function O(A,B,C,D)=F(G(A,B), H(C,D)) at IOB 620. Thus, programmable selector circuits 602 and 604 may be used to create output functions of more variables than the number of variables input by each of programmable logic circuits 606 and 608.

Existing PLD without programmable selector circuits 602 and 604 may generate output functions of more variables than the number of variables input by the programmable logic circuits by recirculation of partial results similar to G(A,B) and H(C,D) through the programmable interconnect circuit; however, the recirculation may have increased overhead that limits the user designs that may be implemented in the existing PLD, and may also cause an increased propagation delay that negatively impacts the operating frequency of the user design in the PLD.

In another example user design, the user design includes an output function that may be factored into F(G( ), H( )) where G( ) and H( ) are identical to other next-state or output functions and at least one of G( ) and H( ) is a next-state function. The LUT of programmable selector circuit 602 may be configured to implement the look-up function F(X, Y) for X=G( ) and Y=H( ). If G( ) is a next-state function, the binary state variable for G( ) may be stored in register 616 and output via multiplexer 612 to both the programmable interconnect circuit 610 and the programmable selector circuit 602. Thus, programmable selector circuit 602 may reuse a next-state function, resulting in a reduction in the circuits needed to implement the user design. It will be appreciated that a LUT for a programmable selector circuit may have more than two inputs.

Existing PLD without programmable selector circuits 602 and 604 may be similar to PLD 600, but with IOB 620 coupled only to register 616. For a user design with the binary state variable of a next-state function mapped to register 616 and without the binary state variable being an output function, such an existing PLD may not be able to utilize IOB 620 for any output function of the user design.

Figure 7:
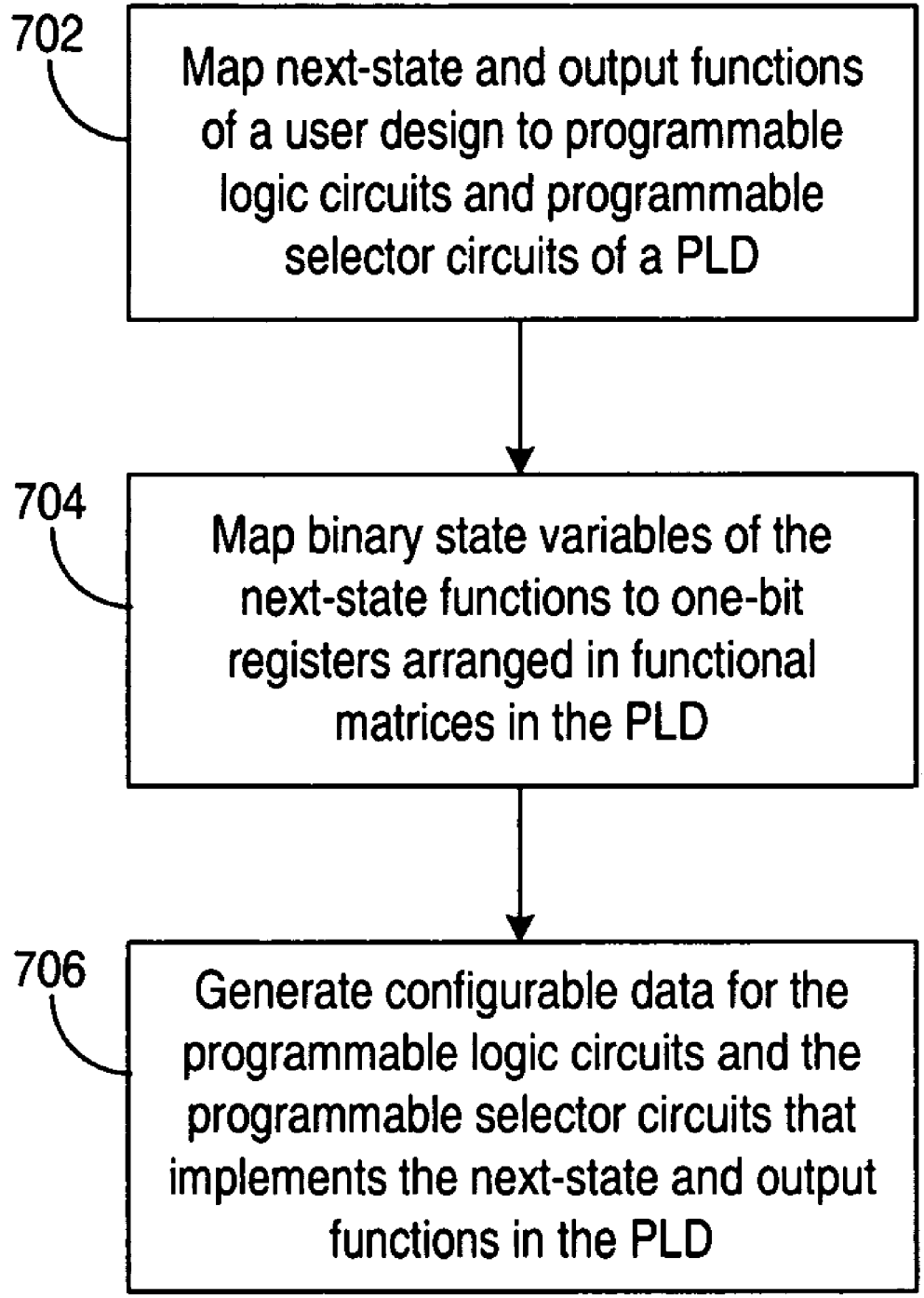
FIG. 7 is a flow diagram of a process for generating a configuration of a PLD for a user design that includes next-state functions and output functions in accordance with various embodiments of the invention.

FIG. 7 is a flow diagram of a process for generating a configuration of a PLD for a user design that includes next-state functions and output functions in accordance with various embodiments of the invention. At step 702, the next-state and output functions of a user design are mapped to programmable logic circuits and programmable selector circuits of a PLD. Each output function is mapped to a programmable selector circuit having an associated pad of the PLD. It will be appreciated that the output function may also be mapped to one or more of the programmable logic circuits.

At step 704, binary state variables of the next-state functions are mapped to one-bit registers of a PLD having the one-bit registers arranged in one or more functional matrices. For each column of each of each functional matrix, the one-bit registers of the column are coupled to a programmable logic circuit corresponding to the column, and for each row of each functional matrix, the one-bit registers of the row are coupled to a corresponding programmable selector circuit for the row.

At step 706, configuration data is generated that implements the next-state functions and the output functions in the PLD according to the mappings. For each of the programmable logic circuits and corresponding column of a functional matrix, the one-bit registers of the column are arranged to store the binary state variables of each of the next-state functions that is mapped to the programmable logic circuit. A programmable selector circuit having a mapped output function is arranged to transmit a value of the output function to the associated pad.

Figure 8:
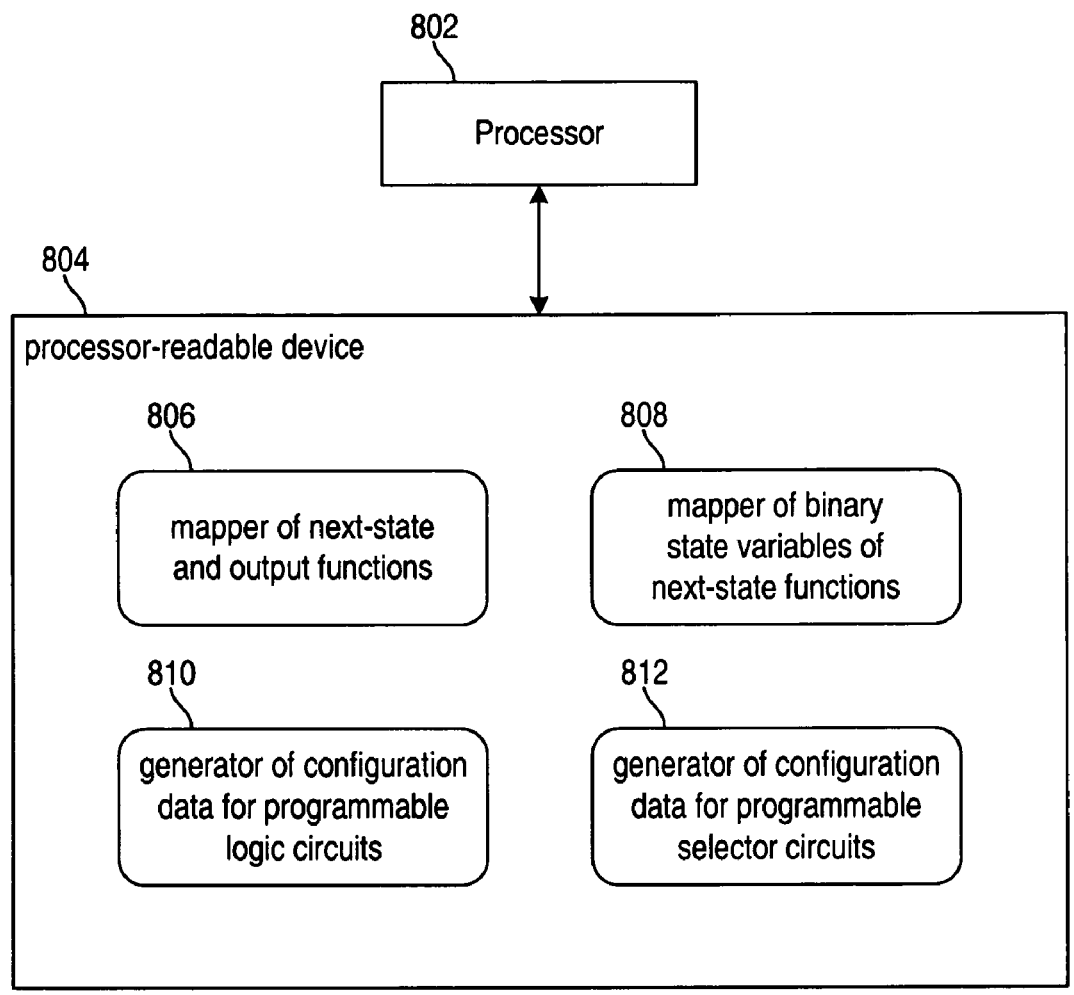
FIG. 8 is a diagram illustrating a program storage medium for generating a configuration of a PLD for a user design that includes next-state and output functions in accordance with various embodiments of the invention.

FIG. 8 is a diagram illustrating a program storage medium for generating a configuration of a PLD for a user design that includes next-state and output functions in accordance with various embodiments of the invention. A processor 802 reads instructions from a processor-readable device 804. Execution of the instructions by processor 804 causes the processor 804 to perform operations that generate a configuration for a PLD, which is configurable to implement a user design having next-state and output functions.

Software module 806 includes instructions for mapping the next-state and output functions of the user design to programmable logic circuits and programmable selector circuits of the PLD. Each output function is mapped to one of the programmable selector circuits, and each programmable selector circuit has an associated pad of the PLD. It will be appreciated that each output function may also be mapped to one or more programmable logic circuits.

Software module 808 includes instructions for mapping binary state variables of the next-state functions to one-bit registers, which are arranged in the PLD in one or more functional matrices. For each column of each functional matrix, the one-bit registers of the column are coupled to one of the programmable logic circuits corresponding to the column. For each row of each functional matrix, the one-bit registers of the row are coupled to one of the programmable selector circuits corresponding to the row.

Software module 810 includes instructions for generating a configuration for the programmable logic circuits. For each of the programmable logic circuits and corresponding column of the at least one functional matrix, the one-bit registers of the column are arranged to store the binary state variables of each of the next-state functions mapped to the programmable logic circuit.

Software module 812 includes instructions for generating a configuration for the programmable selector circuits. A respective programmable selector circuit for each output function transmits a value from the output function to an associated pad.

What is claimed is:

1. A programmable logic device (PLD) configurable to implement a user design, the PLD comprising:
   a programmable interconnect circuit having a plurality of input ports and a plurality of output ports, each of the input and output ports including at least one signal line, the programmable interconnect circuit configurable to connect the signal lines of the output ports to the signal lines of the input ports;
   a plurality of programmable logic circuits, each coupled to a respective one of the output ports of the programmable interconnect circuit, each of the programmable logic circuits configurable to implement a first programmable function of signal values from the respective output port of the programmable interconnect circuit, the first programmable function generating a plurality of one-bit signal values;
   a plurality of one-bit registers, each coupled to one of the programmable logic circuits and arranged to store a respective one of the one-bit signal values from the one of the programmable logic circuits;
   wherein the coupling of each register to a programmable logic circuit bypasses the programmable interconnect circuit;
   a plurality of programmable selector circuits, each coupled to output ports of a plurality of the one-bit registers, wherein each of the one-bit registers is coupled to a respective one of the programmable logic circuits;
   wherein the coupling of each programmable selector circuit to at least one of the registers bypasses the programmable interconnect circuit; and
   a plurality of programmable input/output blocks, each coupled to an output port of a respective one of the programmable selector circuits and to a respective one of the input ports of the programmable interconnect circuit, wherein each of the programmable selector circuits is a look-up table configurable to implement a second programmable function of values from the output ports of the one-bit registers and to supply a value of the second programmable function to the output port of the programmable selector circuit.

2. The PLD of claim 1, wherein each of the programmable selector circuits is a programmable multiplexer configurable to select a value from the output port of one the one-bit registers and supply the value to the output port of the programmable selector circuit.

3. The PLD of claim 1, wherein the programmable interconnect circuit is a programmable interconnect-matrix circuit configurable to connect each of the signal lines of the output ports to a configurable one of the signal lines of the input ports.

4. The PLD of claim 1, wherein a plurality of the one-bit registers are coupled to each one of the programmable logic circuits and each of the one-bit registers is arranged to store the respective one of the one-bit signal values from the one of the programmable logic circuits.

5. The PLD of claim 1, wherein the one-bit registers are arranged in a functional matrix, and for each column and row of the functional matrix, each of the one-bit registers of the column are coupled to one of the programmable logic circuits and store a respective one of the one-bit signal values from the one of the programmable logic circuits, and one of the programmable selector circuits is coupled to the output port of each of the one-bit registers of the row.

6. The PLD of claim 1, wherein each of the input/output blocks is configurable to implement at least one of:

transmission of a value from the output port of the respective one of the programmable selector circuits to a pad associated with the input/output block, and receipt of a value from the pad of the PLD to the respective one of the input ports of the programmable interconnect circuit.

7. The PLD of claim 1 wherein the PLD has from 2 to 32 of the programmable logic circuits, 32 to 1024 of the one-bit registers, 32 to 270 of the programmable selector circuits, and 32 to 270 of the programmable input/output blocks.

8. A programmable logic device (PLD) configurable to implement a user design, the PLD comprising:

a programmable interconnect circuit having a plurality of input ports and a plurality of output ports, each of the input and output ports including at least one signal line, the programmable interconnect circuit configurable to connect the signal lines of the output ports to the signal lines of the input ports;

a plurality of programmable logic circuits, each coupled to a respective one of the output ports of the programmable interconnect circuit, each of the programmable logic circuits configurable to implement a first programmable function of signal values from the respective output port of the programmable interconnect circuit, the first programmable function generating a plurality of one-bit signal values;

a plurality of one-bit registers, each coupled to one of the programmable logic circuits and arranged to store a respective one of the one-bit signal values from the one of the programmable logic circuits;

wherein the coupling of each register to a programmable logic circuit bypasses the programmable interconnect circuit;

a plurality of programmable selector circuits, each coupled to output ports of a plurality of the one-bit registers, wherein each of the one-bit registers is coupled to a respective one of the programmable logic circuits;

wherein the coupling of each programmable selector circuit to at least one of the registers bypasses the programmable interconnect circuit;

a plurality of programmable input/output blocks, each coupled to an output port of a respective one of the programmable selector circuits and to a respective one of the input ports of the programmable interconnect circuit;

wherein each of the programmable logic circuits includes a programmable logic array configurable to implement a second programmable function of the signal values from the respective output port of the programmable interconnect circuit, the second programmable function generating a plurality of one-bit signal values, and wherein the programmable logic array includes an AND plane and an OR plane.

9. The PLD of claim 8, wherein the first programmable function is a programmable function of the one-bit signal values generated by the second programmable function.

10. The PLD of claim 8, wherein the second programmable function generates each of the one-bit signal values from a sum of a configurable subset of a plurality of product terms, each product term being a product of a configurable subset of the signal values from the respective output port of the programmable interconnect circuit.

11. The PLD of claim 8, wherein each of the programmable selector circuits is a programmable multiplexer configurable to select a value from the output port of one the one-bit registers and supply the value to the output port of the programmable selector circuit.

12. The PLD of claim 8, wherein the programmable interconnect circuit is a programmable interconnect-matrix circuit configurable to connect each of the signal lines of the output ports to a configurable one of the signal lines of the input ports.

13. The PLD of claim 8, wherein a plurality of the one-bit registers are coupled to each one of the programmable logic circuits and each of the one-bit registers is arranged to store the respective one of the one-bit signal values from the one of the programmable logic circuits.

14. The PLD of claim 8, wherein the one-bit registers are arranged in a functional matrix, and for each column and row of the functional matrix, each of the one-bit registers of the column are coupled to one of the programmable logic circuits and store a respective one of the one-bit signal values from the one of the programmable logic circuits, and one of the programmable selector circuits is coupled to the output port of each of the one-bit registers of the row.

15. The PLD of claim 8, wherein each of the input/output blocks is configurable to implement at least one of:

transmission of a value from the output port of the respective one of the programmable selector circuits to a pad associated with the input/output block, and receipt of a value from the pad of the PLD to the respective one of the input ports of the programmable interconnect circuit.

16. The PLD of claim 8, wherein the PLD has from 2 to 32 of the programmable logic circuits, 32 to 1024 of the one-bit registers, 32 to 270 of the programmable selector circuits, and 32 to 270 of the programmable input/output blocks.

\* \* \* \* \*